(12) United States Patent
Volatier et al.

(10) Patent No.: US 10,037,925 B2
(45) Date of Patent: Jul. 31, 2018

(54) REMOVABLE SACRIFICIAL CONNECTIONS FOR SEMICONDUCTOR DEVICES

(71) Applicant: Qorvo US, Inc., Greensboro, NC (US)

(72) Inventors: Alexandre Christian Volatier, Longwood, FL (US); Guillermo Moreno Granado, Orlando, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/357,465

(22) Filed: Nov. 21, 2016

(65) Prior Publication Data

US 2017/0256467 A1 Sep. 7, 2017

Related U.S. Application Data

(60) Provisional application No. 62/303,446, filed on Mar. 4, 2016.

(51) Int. Cl.
*H01L 21/66* (2006.01)
*H01L 23/00* (2006.01)
*H01L 23/544* (2006.01)
*H01L 21/78* (2006.01)

(52) U.S. Cl.
CPC ............. *H01L 22/14* (2013.01); *H01L 21/78* (2013.01); *H01L 22/32* (2013.01); *H01L 23/544* (2013.01); *H01L 24/09* (2013.01); *H01L 24/17* (2013.01); *H01L 24/81* (2013.01); *H01L 2224/175* (2013.01); *H01L 2224/17104* (2013.01); *H01L 2224/81001* (2013.01); *H01L 2224/81052* (2013.01); *H01L 2924/01013* (2013.01); *H01L 2924/01029* (2013.01); *H01L 2924/01079* (2013.01)

(58) Field of Classification Search
CPC .......... H01L 2224/81052; H01L 24/17; H01L 2224/81; H01L 2224/17104; H01L 24/83
USPC ..................................... 438/14, 15
See application file for complete search history.

(56) References Cited

U.S. PATENT DOCUMENTS

| | | | | |
|---|---|---|---|---|
| 6,411,116 B1* | 6/2002 | DeHaven | ........... | G01R 1/07314 324/754.18 |
| 7,052,922 B2* | 5/2006 | Lindgren | ............... | H01L 21/288 257/48 |
| 2014/0113396 A1* | 4/2014 | Wissman | ............. | H03H 3/0072 438/50 |
| 2017/0250152 A1* | 8/2017 | Scharf | ..................... | H01L 24/08 |

* cited by examiner

*Primary Examiner* — S. V. Clark
(74) *Attorney, Agent, or Firm* — Withrow & Terranova, P.L.L.C.

(57) ABSTRACT

Methods of fabricating semiconductor devices and Radio Frequency (RF) components are provided. The method includes providing a circuit layout on a semiconductor layer and providing one or more sacrificial connections to connect bump pads in the circuit layout. The method also includes testing the circuit layout using the one or more sacrificial connections and removing at least a portion of the one or more sacrificial connections. In this way, the performance of the semiconductor device is improved by reducing or avoiding capacitive or inductive leakage paths that can be caused by leftover materials.

20 Claims, 7 Drawing Sheets

US 10,037,925 B2

REMOVABLE SACRIFICIAL CONNECTIONS FOR SEMICONDUCTOR DEVICES

RELATED APPLICATIONS

This application claims the benefit of provisional patent application Ser. No. 62/303,446, filed Mar. 4, 2016, the disclosure of which is hereby incorporated herein by reference in its entirety.

FIELD OF THE DISCLOSURE

The present disclosure relates to fabricating semiconductor devices.

BACKGROUND

Semiconductor devices are used in a variety of different circuitry, and are often found in mobile communication devices. Many of these semiconductor devices are fabricated on a wafer of a semiconductor material. These semiconductor devices often need to be tested before being removed from the wafer or before being packaged. One way to test these semiconductor devices is to use a fixed "probe card" that provides an electrical path between the test system and the circuit layouts of the semiconductor devices on the wafer. While this permits the testing and validation of the circuits before they are diced and packaged, the fixed nature of the probe card means that a new one must be made for any changes to the circuit layout.

Alternatively, the probe tip method is more flexible than using a probe card as it can be used for different input/output configurations and for other changes to the circuit layout. However, the probe tip method requires the existence of electrical connections between ground ports or bump pads in the circuit layouts to ensure proper characterization as the ground reference for both ground probes need to be connected on the wafer. These electrical connections are made of metal at the outer edges of the dies in the sawing streets. When testing is completed, these electrical connections are severed. Although the severed connections are no longer connecting the components, their presence may negatively affect the performance of the semiconductor device by creating capacitive or inductive leakage paths.

Accordingly, improved methods of fabricating semiconductor devices are needed with reduced capacitive or inductive leakage paths.

SUMMARY

Methods of fabricating semiconductor devices and Radio Frequency (RF) components are provided. A method includes providing a circuit layout on a semiconductor layer and providing one or more sacrificial connections to connect bump pads in the circuit layout. The method also includes testing the circuit layout using the one or more sacrificial connections and removing at least a portion of the one or more sacrificial connections. In this way, the performance of the semiconductor device is improved by reducing or avoiding capacitive or inductive leakage paths that can be caused by leftover materials.

Additionally, a method of fabricating a RF component such as a filter or duplexer is provided that includes providing a circuit layout for the RF component on a semiconductor layer and providing one or more sacrificial connections to connect bump pads in the circuit layout. The method also includes testing the circuit layout using the one or more sacrificial connections and removing at least a portion of the one or more sacrificial connections. In this way, the performance of the RF component is improved by reducing or avoiding capacitive or inductive leakage paths that can be caused by leftover materials.

In some embodiments, providing the sacrificial connections includes providing the sacrificial connections as part of an Under Bump Metallization (UBM) layer. In some embodiments, these methods allow a saw street width between adjacent circuit layouts that is reduced compared to a saw street width necessary for cutting off the sacrificial connections. In some embodiments, these methods allow a sacrificial connection not fully located in the saw street which can provide additional testing capabilities. In some embodiments, removing the sacrificial connections includes etching away at least a portion of the sacrificial connections such as by wet etching Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
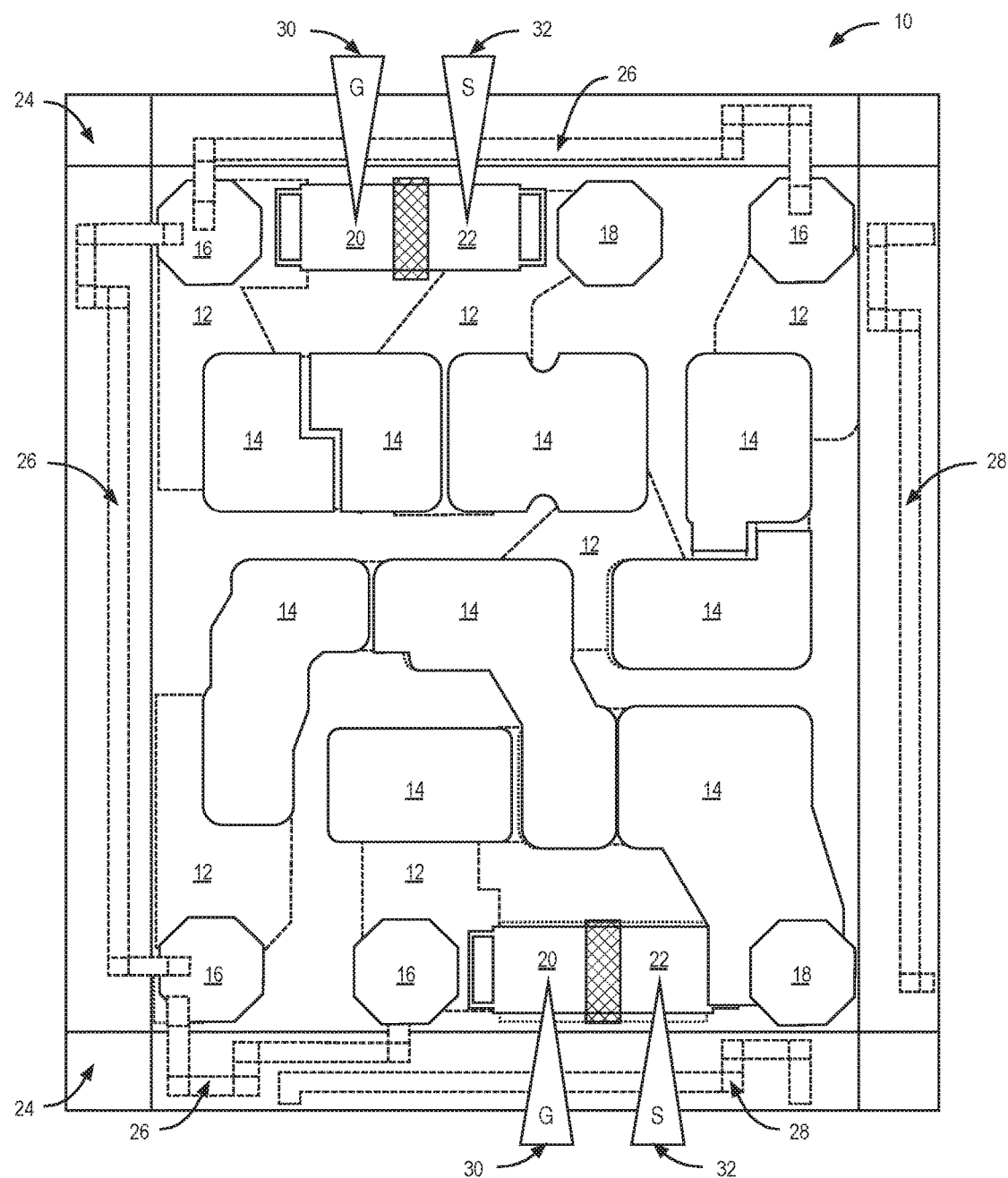
FIG. 1 illustrates a layout of a semiconductor device with ground loops connecting all ground bump pads.

FIG. 1 illustrates a layout of a semiconductor device with ground loops connecting all ground bump pads. Specifically, a semiconductor layer 10 is provided that includes a circuit layout. This circuit layout is on a wafer that includes several other circuit layouts adjacent to the circuit layout. These circuit layouts need to be tested before they are separated and packaged.

The circuit layout of FIG. 1 is merely an example, and the embodiments discussed herein apply equally to other circuit layouts. This circuit layout includes a bottom electrode 12 and a top electrode 14. In this circuit layout there are four ground bump pads 16 and two signal bump pads 18. These allow connections to be made to other chips or circuits. In some embodiments, in order to connect the semiconductor device to external circuitry, solder bumps are deposited onto the ground bump pads 16 and the signal bump pads 18. These solder bumps are often included during the final wafer processing steps.

Testing semiconductor devices using the probe tip method is more flexible than using a probe card as it can be used for different input/output configurations and for other changes to the circuit layout. In order to facilitate this probe tip testing, ground probe pads 20 and signal probe pads 22 are included in the circuit layout. However, the probe tip method requires the existence of electrical connections between the various ground bump pads 16 in the circuit layouts to ensure proper characterization, as the ground reference for both ground probe pads 20 needs to be connected on the wafer.

These electrical connections are made of metal at the outer edges of the dies in sawing streets 24. As used herein, the electrical connections that connect the ground bump pads 16 are called ground loops 26. In addition to the ground loops 26 of the circuit layout, the sawing streets 24 may also contain ground loops 28 from adjacent circuit layouts.

FIG. 1 further shows that ground probes 30 and signal probes 32 are connected to the ground probe pads 20 and the signal probe pads 22, respectively. In order to probe or test the circuit layout, a signal is sent into the circuit layout. This requires at least two conductors, the signal and the ground. Depending on the semiconductor device being fabricated, the testing operation may involve the evaluation of various parameters such as isolation for a duplexer and rejection for a filter. In some embodiments, testing the circuit layout may also involve modifying a portion of the circuit layout for the semiconductor device based on results of the testing in order to improve performance of the semiconductor device. For instance, this may include frequency adjustment by trimming one or more parts of the circuit layout.

Figure 2:
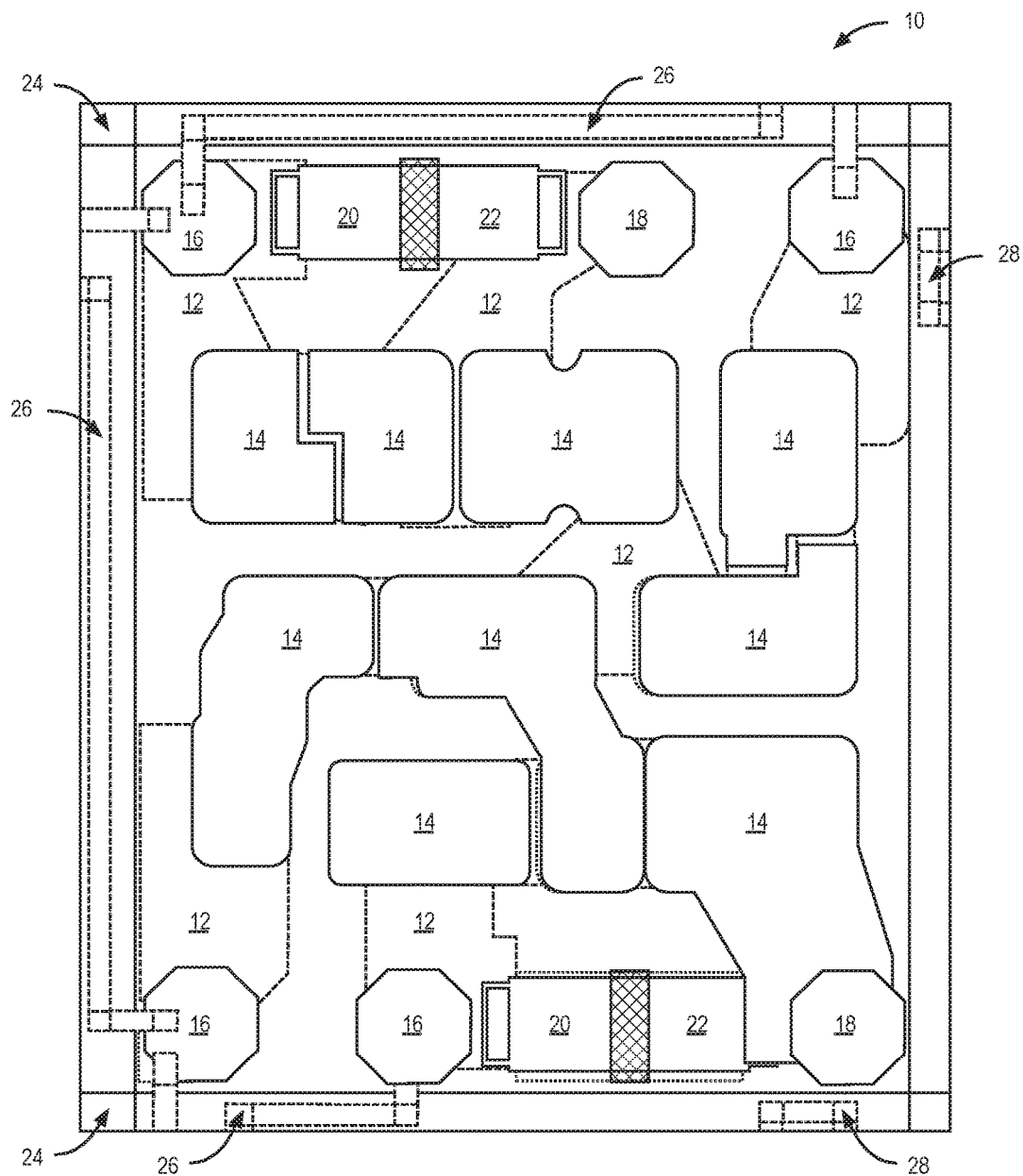
FIG. 2 illustrates the layout of FIG. 1 after dicing to sever the ground loops. Leftover ground loops remain at the outer edges.

When testing of the circuit layout is completed, the ground loops 26 are severed in preparation for module implementation. FIG. 2 illustrates the layout of FIG. 1 after dicing to sever the ground loops 26 and to separate the semiconductor device from any adjacent circuit layouts. Leftover portions of the ground loops 26 remain at the outer edges. Also, leftover portions of the ground loops 28 from adjacent circuit layouts may also remain. Although the severed connections are no longer connecting the components, their presence may negatively affect the performance of the semiconductor device by creating capacitive or inductive leakage paths. Accordingly, improved methods of fabricating semiconductor devices are needed with reduced capacitive or inductive leakage paths.

Methods of fabricating semiconductor devices and Radio Frequency (RF) components are provided. A method includes providing a circuit layout on a semiconductor layer and providing one or more sacrificial connections to connect bump pads in the circuit layout. The method also includes testing the circuit layout using the one or more sacrificial connections and removing at least a portion of the one or more sacrificial connections. In this way, the performance of the semiconductor device is improved by reducing or avoiding capacitive or inductive leakage paths that can be caused by leftover materials.

Additionally, a method of fabricating an RF component such as a filter or duplexer is provided that includes providing a circuit layout for the RF component on a semiconductor layer and providing one or more sacrificial connections to connect bump pads in the circuit layout. The method also includes testing the circuit layout using the one or more sacrificial connections and removing at least a portion of the one or more sacrificial connections. In this way, the performance of the RF component is improved by reducing or avoiding capacitive or inductive leakage paths that can be caused by leftover materials.

Figure 3:
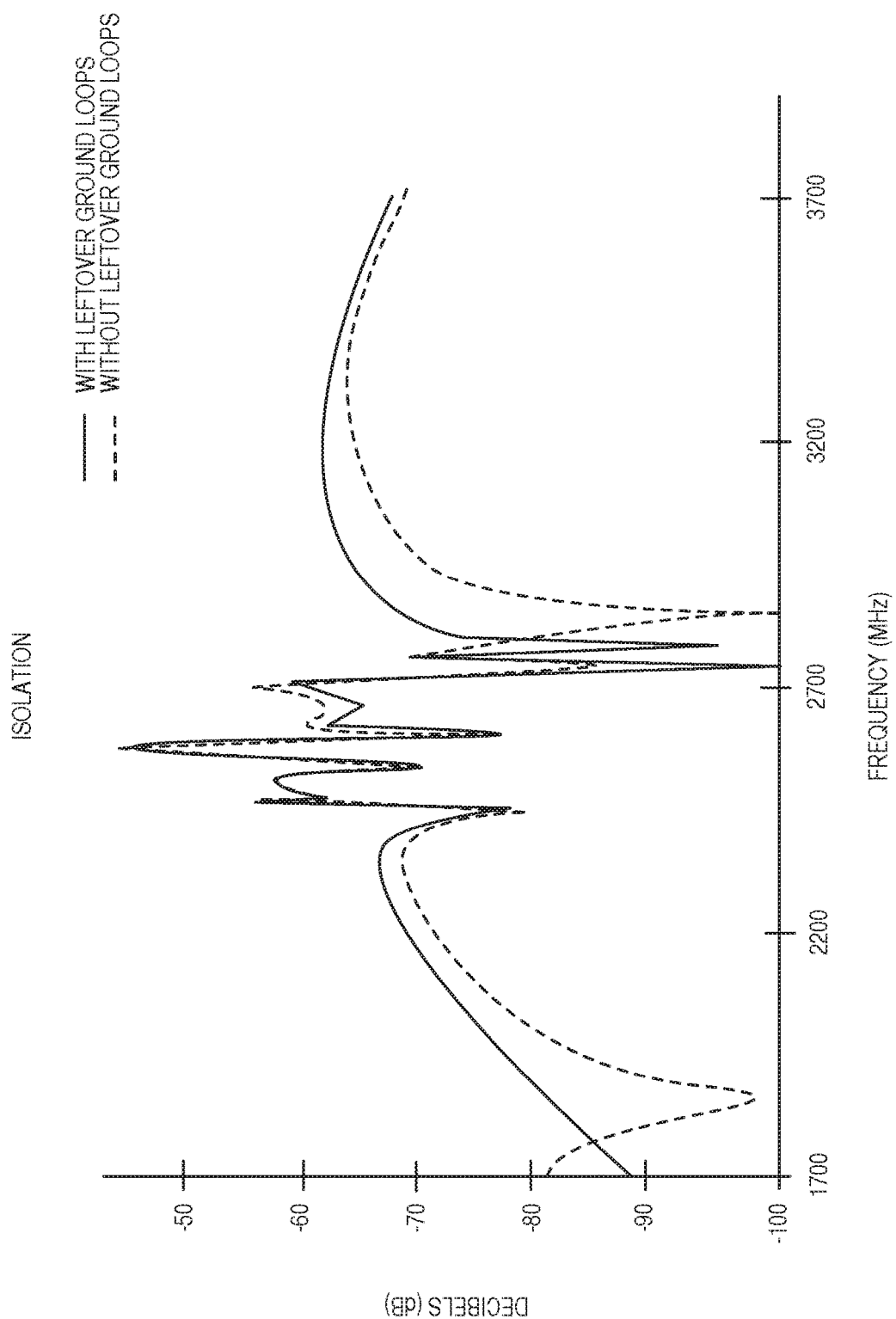
FIG. 3 illustrates a simulation of the isolation of a Band 7 duplexer with and without leftover ground loops.

To illustrate improvements provided according to some embodiments, FIG. 3 illustrates a simulation of the isolation of a Band 7 Long Term Evolution (LTE) duplexer with and without the leftover ground loops 26. Band 7 is a Frequency-Division Duplexing (FDD) band that uses 2500-2570 megahertz (MHz) for uplink transmissions (where a wireless device is transmitting and a base station is receiving) and 2620-2690 MHz for downlink transmissions (where the base station is transmitting and the wireless device is receiving).

FIG. 3 illustrates that the isolation degrades substantially when leftover portions of the ground loops 26 remain which may significantly impact the design of the duplexer. This provides a motivation for fabricating semiconductor devices and RF components using removable sacrificial connections as is shown in FIGS. 5A through 5C.

Figure 4:
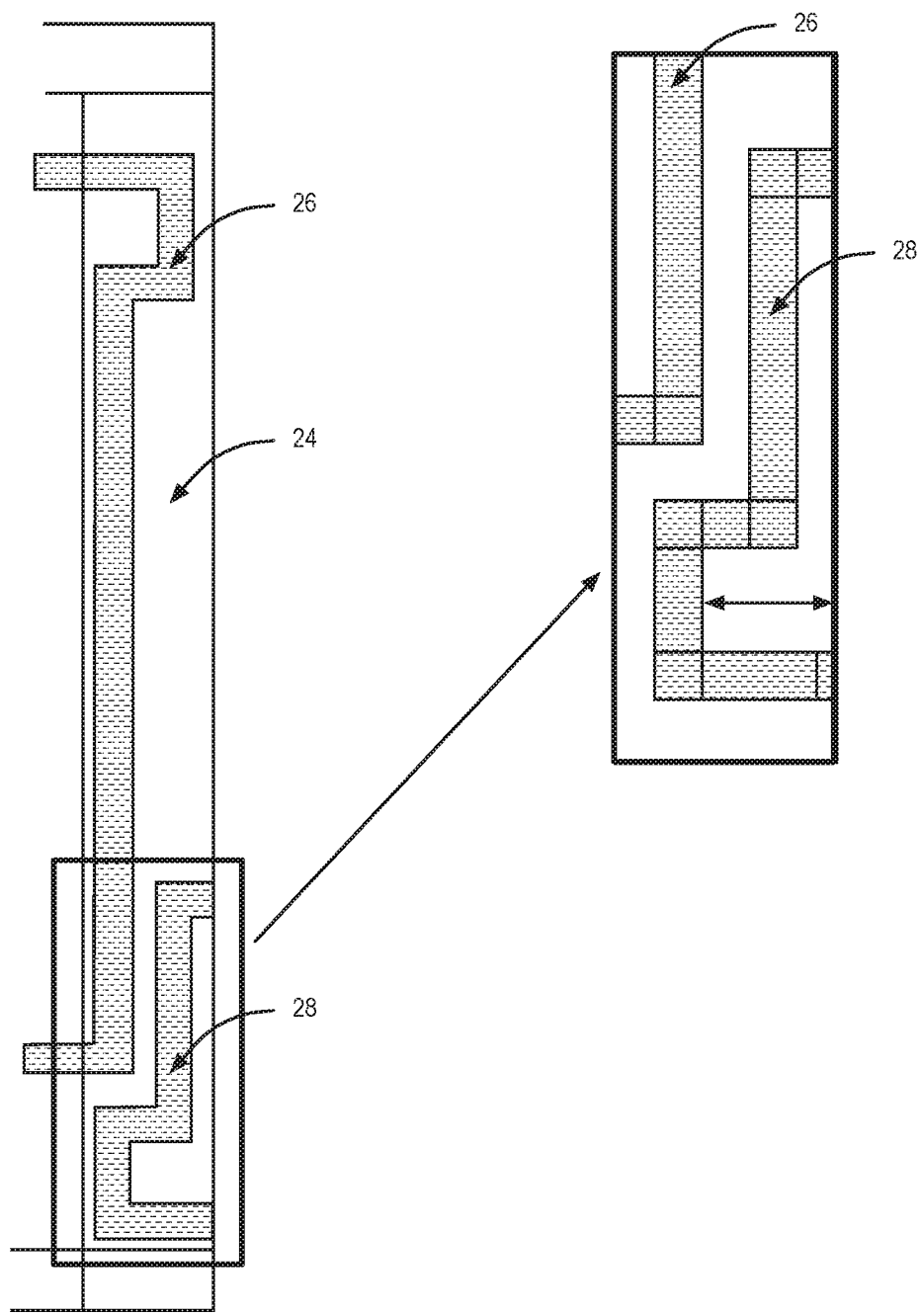
FIG. 4 is a close up view of a saw street of the layout of FIG. 1 showing ground loops and that a minimum opening needs to be maintained to ensure the connections are cut through during dicing, as shown in FIG. 2.

FIG. 4 is a close up view of the saw street 24 of the layout of FIG. 1 showing the ground loops 26 and the ground loops 28 from adjacent circuit layouts. FIG. 4 illustrates that a minimum opening needs to be maintained to ensure that the connections created by the ground loops 26 and the ground loops 28 are cut through during dicing, as shown in FIG. 2. Specifically, additional space is needed to account for inaccuracy of the dicing process to disconnect the ground loops 26. Maintaining proper connections for each die involves keeping enough clearance between connections leading to wasted die area. This also provides a motivation for fabricating semiconductor devices and RF components using removable sacrificial connections as is shown in FIGS. 5A through 5C.

Figure 5A:
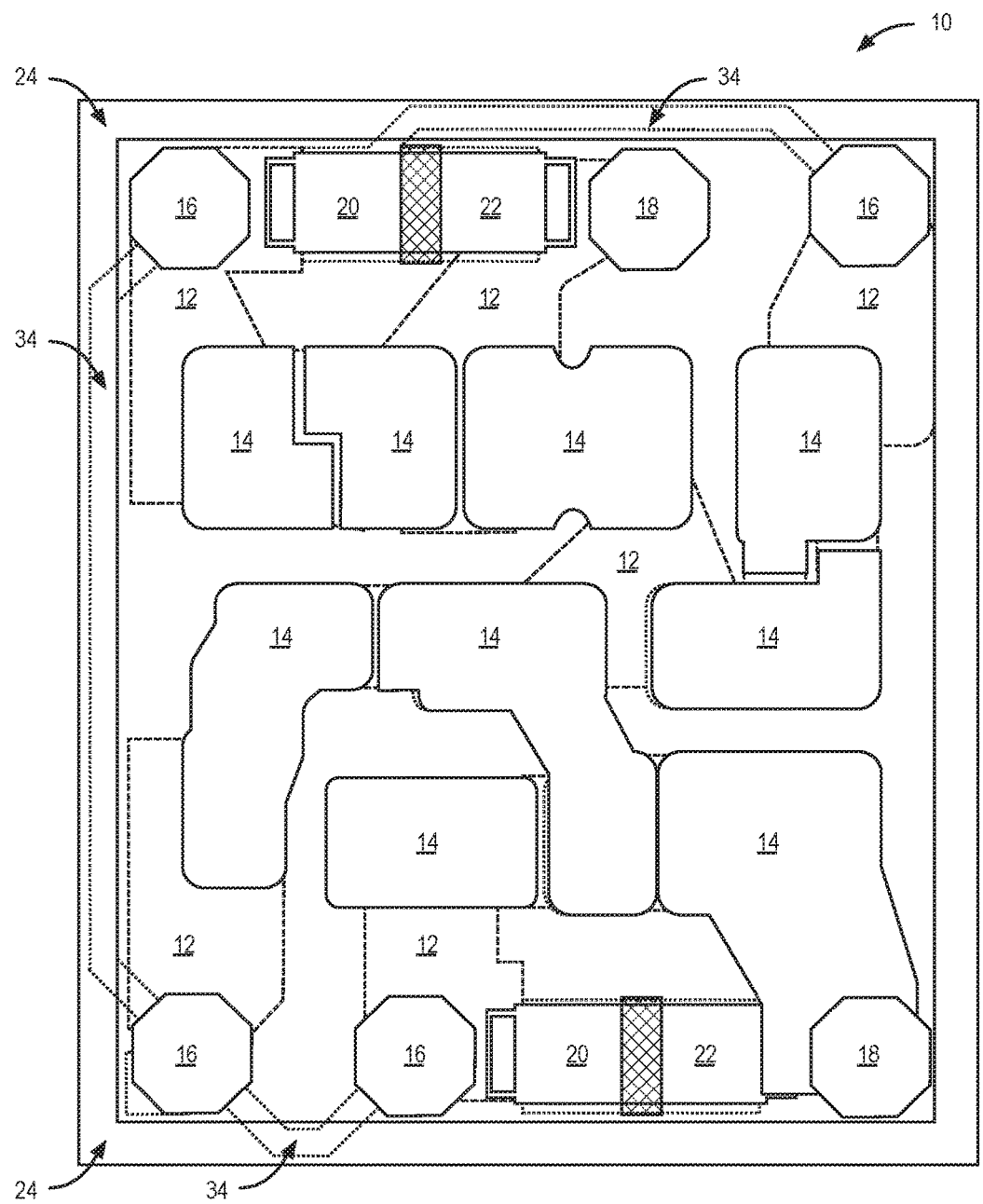
FIGS. 5A through 5C illustrate fabricating a semiconductor device, according to some embodiments of the present disclosure.
Figure 5B:
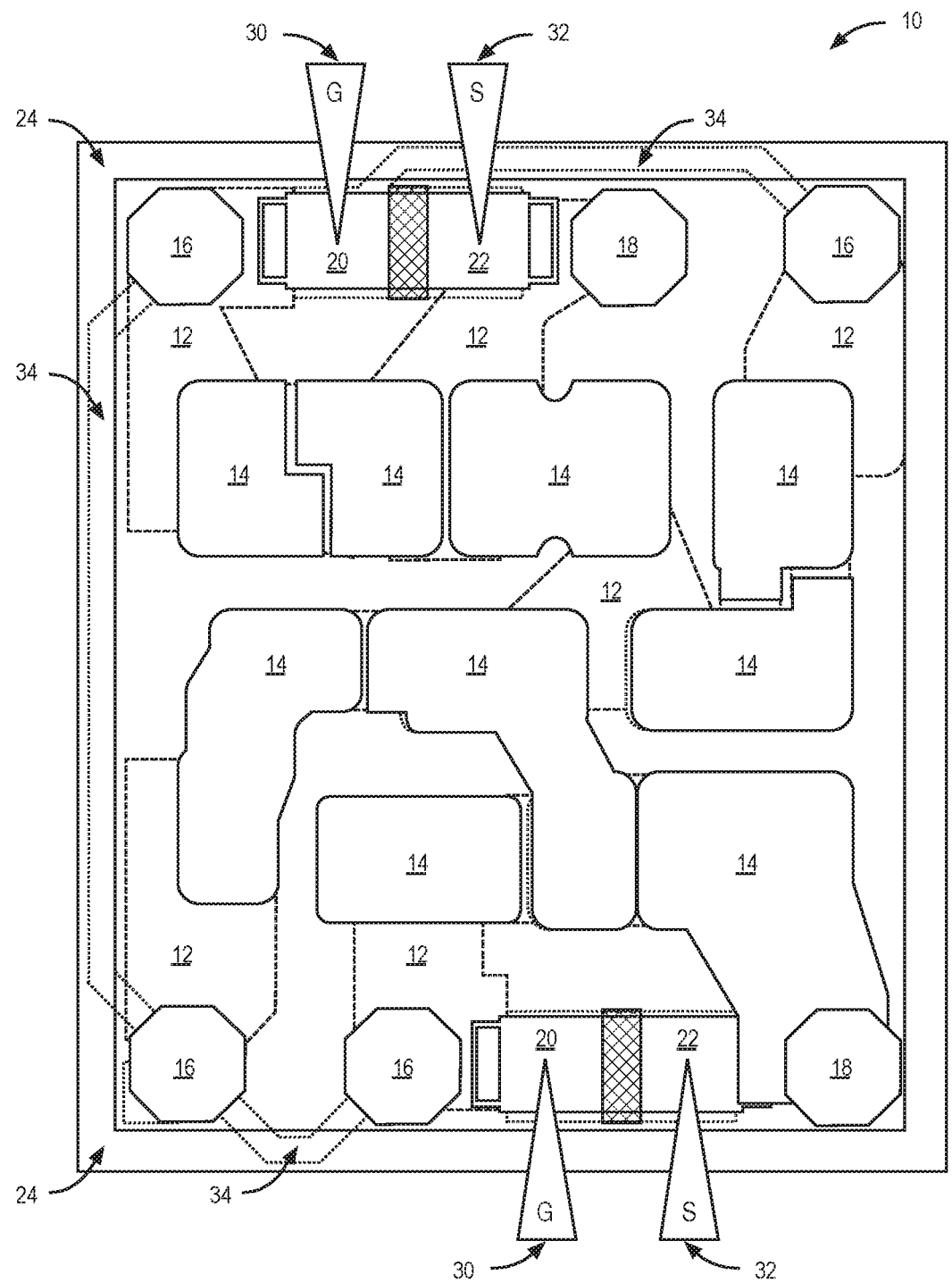
Figure 5C:
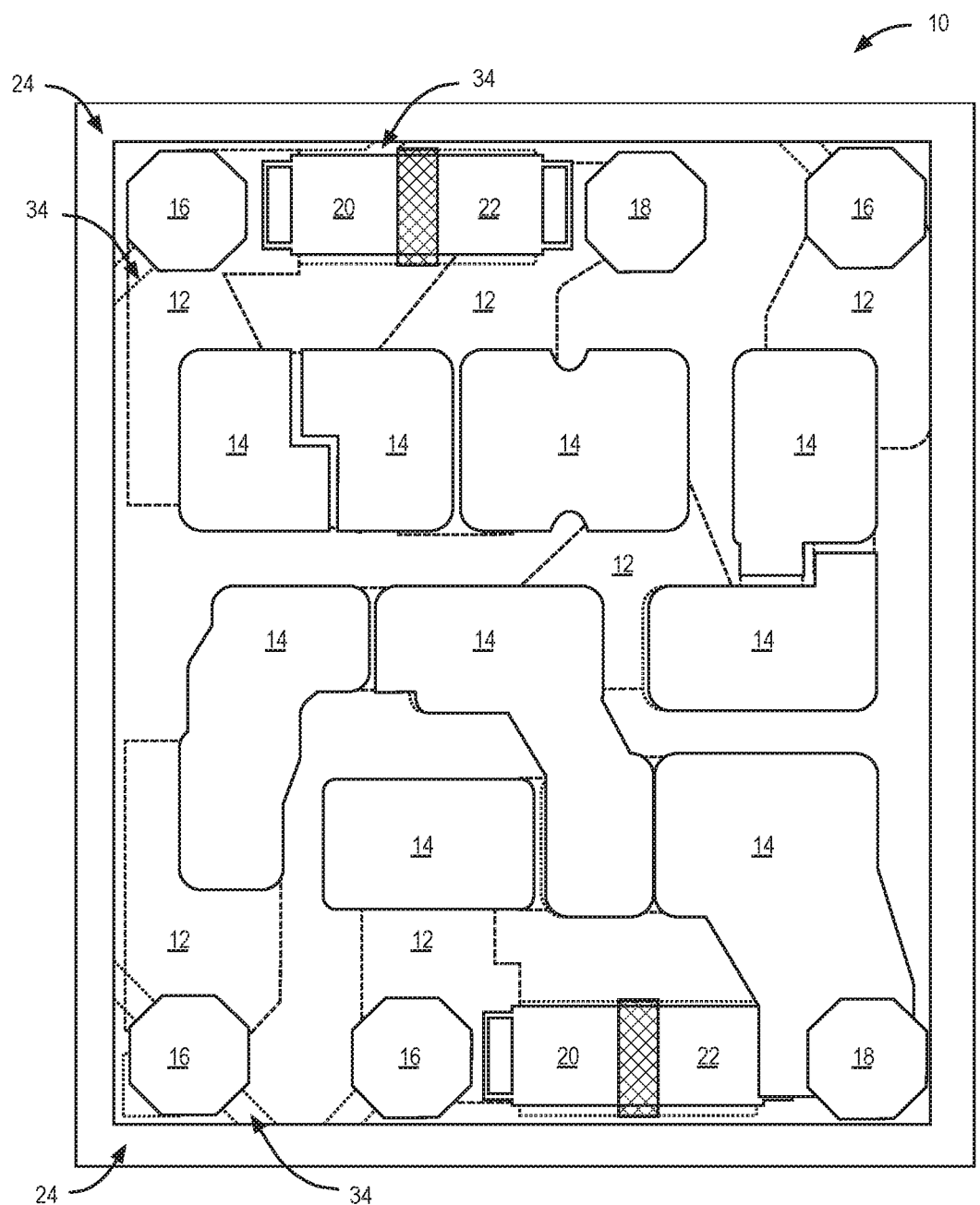

FIGS. 5A through 5C illustrate fabricating a semiconductor device, according to some embodiments of the present disclosure. FIG. 5A is similar to FIG. 1 and illustrates the semiconductor layer 10 that includes a circuit layout. This circuit layout may be on a wafer that includes several other circuit layouts adjacent to the circuit layout.

As before, these circuit layouts need to be tested before they are separated and packaged. However, instead of using the ground loops 26, 28 to connect the various ground bump pads 16, the one or more sacrificial connections 34 are provided to connect the ground bump pads 16 and/or the signal bump pads 18 in the circuit layout. In some embodiments, the sacrificial connections 34 are created as part of an Under Bump Metallization (UBM) where the UBM may be a material such as aluminum (Al), gold (Au), copper (Cu), or any other suitable material. Typically in semiconductor device fabricating, the UBM is thicker than other layers which enhances conductivity.

FIG. 5B illustrates testing the circuit layout using the one or more sacrificial connections 34. FIG. 5B shows that the ground probes 30 and the signal probes 32 are connected to the ground probe pads 20 and the signal probe pads 22, respectively. In order to probe or test the circuit layout, a signal is sent into the circuit layout. This requires at least two conductors, the signal and the ground. Depending on the semiconductor device being fabricated, the testing operation may involve the evaluation of various parameters such as isolation for a duplexer and rejection for a filter. In some embodiments, testing the circuit layout may also involve modifying a portion of the circuit layout for the semiconductor device based on results of the testing in order to improve performance of the semiconductor device. For instance, this may include frequency adjustment by trimming one or more parts of the circuit layout. The sacrificial connections 34 between the ground bump pads 16 ensure a low resistive connection between the various ground probes 30 maintaining accuracy needed to ensure that the dies with the right properties are selected for continued processing (die sort).

Depending on the circuit layout, the sacrificial connections 34 may be used to connect two or more of the ground bump pads 16 and/or two or more of the signal bump pads 18. This allows a test signal to be extended to various portions of the circuit layout.

After testing is complete, instead of dicing to sever the connections, FIG. 5C shows removing at least a portion of the one or more sacrificial connections 34 to sever the connections. Depending on the specific implementation, varying amounts of the sacrificial connections 34 can be removed. As shown in FIG. 5C, the portions of the sacrificial connections 34 in the sawing streets 24 are removed. In other embodiments, more or less of the sacrificial connections 34 might be removed depending on technique and desired characteristics.

In some embodiments, removing the portion of the one or more sacrificial connections 34 is accomplished by etching away the portion of the one or more sacrificial connections 34. This may either be a dry etch, a wet etch, or other suitable etching technique. Depending on the specific implementation, etching usually involves applying a protective resist material to any part of the circuit layout that is not to be etched. Then, a plasma chemical agent for dry etching or a liquid chemical agent for wet etching removes the uppermost layer in the areas that are not protected by the protective resist material. The protective resist material can then be removed if necessary. The choice between dry etching and wet etching might depend on the material used for the sacrificial connections 34 and/or the amount of overetch allowed. In some embodiments, a wet etch solution with good selectivity on materials other than the material used for the sacrificial connections 34 (e.g., a UBM metal) is desirable.

In some embodiments, providing the sacrificial connections 34 to connect the ground bump pads 16 and/or the signal bump pads 18 in the circuit layout also includes refraining from passivating the sacrificial connections 34 (e.g., no dielectric material on top). This may facilitate the removal of the sacrificial connections 34, especially when etching is used to remove the sacrificial connections 34.

By removing the sacrificial connections 34 from the circuit layout in FIG. 5C, the performance of the semiconductor device is improved by reducing or avoiding capacitive or inductive leakage paths that can be caused by leftover materials.

In addition, since the sacrificial connections 34 are removed without the need of dicing, one or more of the sacrificial connections 34 could be used that is not fully located in the saw street 24. For instance, one of the one or more sacrificial connections 34 connecting ground bump pads 16 would not be limited to the die edges but could be found inside the circuit layout since the sacrificial connections 34 are no longer separated by dicing but by etching, for instance. This allows for additional design flexibility, which might not be possible using the ground loops 26 as in FIG. 1.

The ability to provide the sacrificial connections 34 not in the saw street 24 and the fact that dicing is not required to sever the sacrificial connections 34 leads to more potential benefits. For instance, the width of the saw street 24 between adjacent circuit layouts can be reduced compared to the width of a saw street 24 necessary for cutting off at least one of the sacrificial connections 34. This results in additional circuit layouts on the semiconductor layer 10. More semiconductor devices per wafer can increase the production rate and/or reduce the overall cost of each semiconductor device.

Also, when dicing is not required to sever the sacrificial connections 34, additional dicing methods are able to be used. For instance, stealth dicing the semiconductor layer can be used to separate the circuit layouts where a kerf of the stealth dicing is less than one micrometer ($\mu$m). In some implementations, stealth dicing uses a laser to cut the semiconductor layer 10 into pieces by heating the inside of the semiconductor layer 10 in a small area. The intense temperature gradient between this heated area and the surrounding parts of the semiconductor layer 10 causes the semiconductor layer 10 to crack, separating the semiconductor devices. This leads to an extremely small kerf of the stealth dicing that is often less than one $\mu$m. Additionally, this process creates little or no debris as compared to a traditional dicing method. The ability to use stealth dicing can also result in additional circuit layouts on the semiconductor layer 10.

Those skilled in the art will recognize improvements and modifications to the preferred embodiments of the present disclosure. All such improvements and modifications are considered within the scope of the concepts disclosed herein and the claims that follow.

What is claimed is:

1. A method of fabricating a semiconductor device comprising:
   providing a circuit layout on a semiconductor layer;
   providing one or more sacrificial connections to connect a plurality of bump pads in the circuit layout;
   testing the circuit layout using the one or more sacrificial connections; and
   removing at least a portion of the one or more sacrificial connections.

2. The method of claim 1 wherein providing the one or more sacrificial connections to connect the plurality of bump pads in the circuit layout comprises providing the one or more sacrificial connections as part of an Under Bump Metallization (UBM) layer.

3. The method of claim 2 wherein the UBM layer is a material chosen from the group consisting of aluminum, gold, and copper.

4. The method of claim 1 wherein the plurality of bump pads in the circuit layout comprises at least two ground bump pads, and at least one of the one or more sacrificial connections connect two ground bump pads.

5. The method of claim 1 wherein the plurality of bump pads in the circuit layout comprises at least two signal bump pads and at least one of the one or more sacrificial connections connects two signal bump pads.

6. The method of claim 1 further comprising providing a plurality of circuit layouts on the semiconductor layer with a saw street width between adjacent circuit layouts of the plurality of circuit layouts and wherein the saw street width is reduced compared to a saw street width necessary for cutting off at least one of the one or more sacrificial connections.

7. The method of claim 6 further comprising, after removing at least the portion of the one or more sacrificial connections, dicing the semiconductor layer to separate the plurality of circuit layouts.

8. The method of claim 7 wherein dicing the semiconductor layer to separate the plurality of circuit layouts comprises stealth dicing the semiconductor layer to separate the plurality of circuit layouts where a kerf of the stealth dicing is less than one micrometer (μm).

9. The method of claim 1 further comprising providing a plurality of circuit layouts on the semiconductor layer with a saw street between adjacent circuit layouts of the plurality of circuit layouts and wherein at least one of the one or more sacrificial connections is not fully located in the saw street.

10. The method of claim 1 wherein removing at least the portion of the one or more sacrificial connections comprises etching away at least the portion of the one or more sacrificial connections.

11. The method of claim 10 wherein etching away at least the portion of the one or more sacrificial connections comprises wet etching at least the portion of the one or more sacrificial connections.

12. The method of claim 10 wherein providing the one or more sacrificial connections to connect the plurality of bump pads in the circuit layout further comprises refraining from passivating the one or more sacrificial connections.

13. The method of claim 1 wherein testing the circuit layout using the one or more sacrificial connections comprises placing a plurality of probe tips on a corresponding plurality of probe pads in the circuit layout where at least one probe pad of the plurality of probe pads is connected to a sacrificial connection of the one or more sacrificial connections.

14. A method of fabricating a Radio Frequency (RF) filter comprising:
   providing a circuit layout for the RF filter on a semiconductor layer;
   providing one or more sacrificial connections to connect a plurality of bump pads in the circuit layout;
   testing the circuit layout for the RF filter using the one or more sacrificial connections; and
   removing at least a portion of the one or more sacrificial connections.

15. The method of claim 14 wherein testing the circuit layout for the RF filter using the one or more sacrificial connections comprises placing a plurality of probe tips on a corresponding plurality of probe pads in the circuit layout for the RF filter where at least one probe pad of the plurality of probe pads is connected to a sacrificial connection of the one or more sacrificial connections.

16. The method of claim 15 wherein testing the circuit layout for the RF filter using the one or more sacrificial connections further comprises modifying a portion of the circuit layout for the RF filter based on results of the testing in order to improve performance of the RF filter.

17. The method of claim 14 wherein providing the one or more sacrificial connections to connect the plurality of bump pads in the circuit layout for the RF filter comprises providing the one or more sacrificial connections as part of an Under Bump Metallization (UBM) layer.

18. The method of claim 14 further comprising providing a plurality of circuit layouts for a corresponding plurality of RF filters on the semiconductor layer with a saw street between adjacent circuit layouts of the plurality of circuit layouts and wherein at least one of the one or more sacrificial connections is not fully located in the saw street.

19. The method of claim 14 wherein removing at least the portion of the one or more sacrificial connections comprises etching away at least the portion of the one or more sacrificial connections.

20. The method of claim 14 wherein removing at least the portion of the one or more sacrificial connections comprises etching away at least the portion of the one or more sacrificial connections.

* * * * *